United States Patent [19]

Maida

[11] Patent Number: 5,416,365
[45] Date of Patent: May 16, 1995

[54] LOCAL FEEDBACK STABILIZED EMITTER FOLLOWER CASCADE

[75] Inventor: Michael X. Maida, San Jose, Calif.

[73] Assignee: National Semiconductor Corporation, Santa Clara, Calif.

[21] Appl. No.: 937,336

[22] Filed: Aug. 31, 1992

[51] Int. Cl.⁶ .................. H03K 19/08; H03F 1/34
[52] U.S. Cl. ..................... 327/111; 330/293; 327/575
[58] Field of Search .......... 307/270, 315, 490; 330/282, 288, 293

[56] References Cited

U.S. PATENT DOCUMENTS

| | | | |
|---|---|---|---|
| 3,517,324 | 6/1970 | Perlman | 330/267 |
| 4,187,472 | 2/1980 | Yum | 330/293 X |
| 4,616,144 | 10/1986 | Hideshima et al. | 307/315 |
| 4,754,158 | 6/1988 | Halberstein | 307/315 X |
| 4,833,424 | 5/1989 | Wright | 330/267 |
| 4,886,985 | 12/1989 | Flohrs et al. | 307/315 |
| 4,931,666 | 6/1990 | Ito | 307/315 |

FOREIGN PATENT DOCUMENTS 1280946 10/1968 Germany .
2095941 10/1982 United Kingdom .

Primary Examiner—Willis R. Wolfe
Attorney, Agent, or Firm—Limbach & Limbach; Vincenzo D. Pitruzzella

[57] ABSTRACT

When plural emitter follower cascaded transistors are employed as a buffer to drive a capacitive load wherein instabilities can occur. The capacitive loads can result in either ringing or oscillation within such a buffer. The invention relates to applying negative feedback around one or more emitter followers in the cascade. In the preferred embodiment a three stage cascade of emitter followers is employed with negative feedback connected around the penultimate stage.

4 Claims, 2 Drawing Sheets

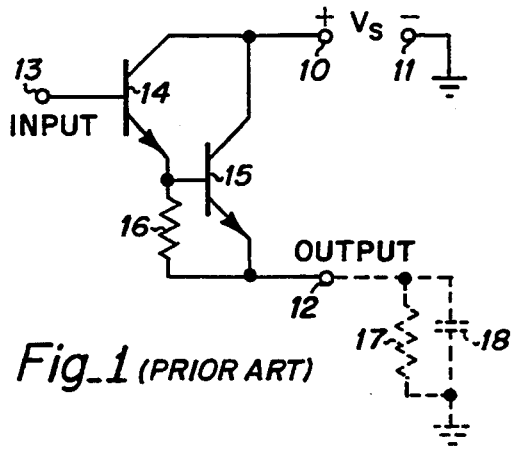
Fig_1 (PRIOR ART)
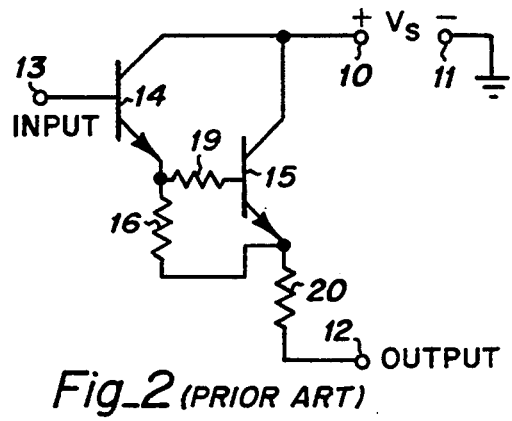
Fig_2 (PRIOR ART)
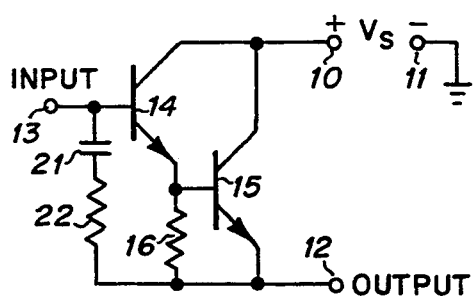
Fig_3 (PRIOR ART)
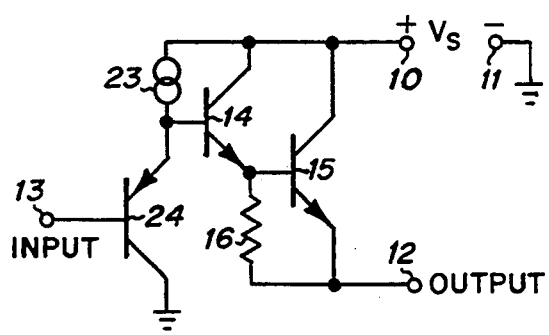
Fig_4 (PRIOR ART)
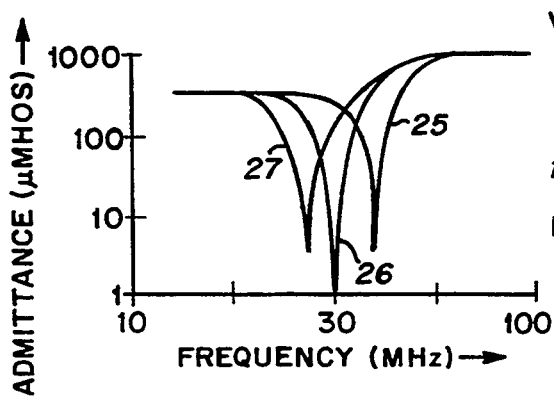
Fig_5 (PRIOR ART)
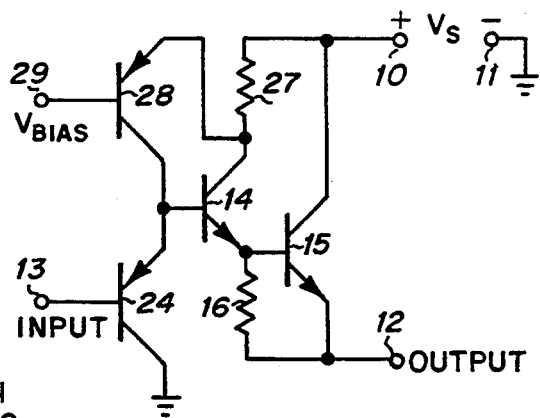
Fig_6

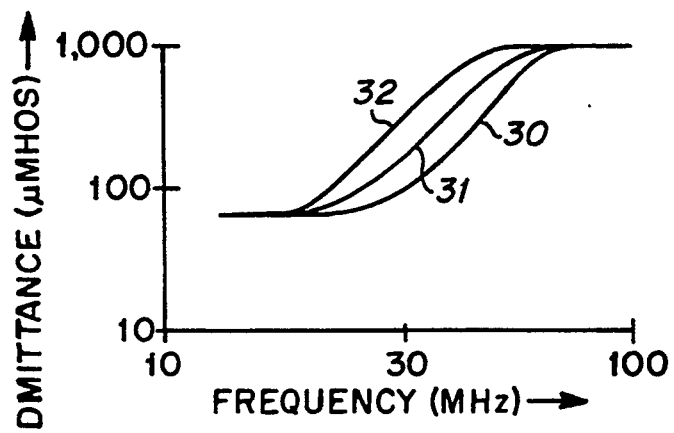
Fig_7
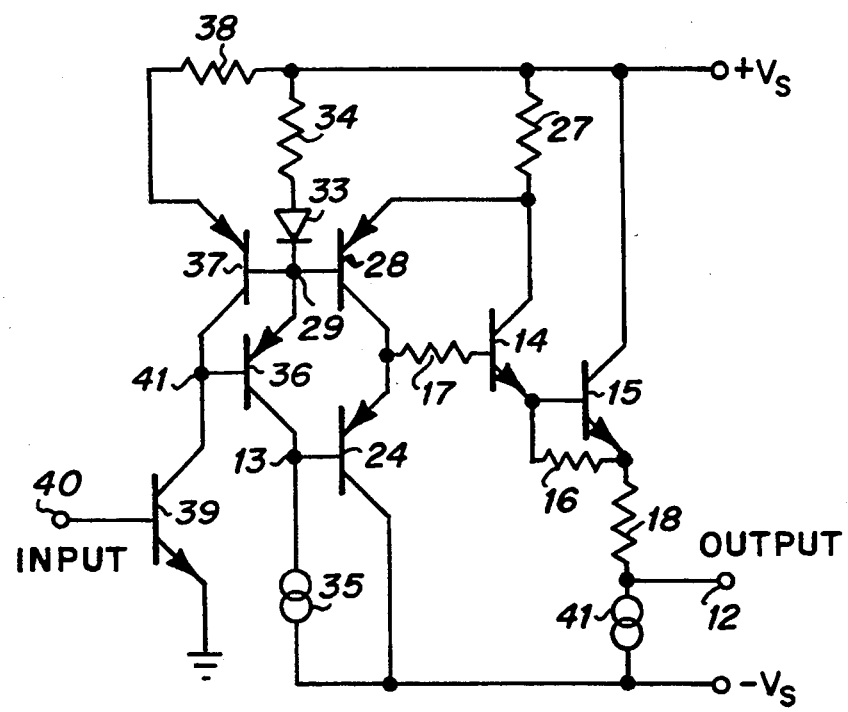
Fig_8

LOCAL FEEDBACK STABILIZED EMITTER FOLLOWER CASCADE

BACKGROUND OF THE INVENTION

Cascaded emitter followers are often used as buffers in integrated circuit (IC) amplifiers. Such a cascade provides close to unity voltage gain which means that the power gain, current gain and output to input isolation are related to the number of stages and the current gain of each stage. For example, a two stage cascade will have a current gain of approximately Beta squared where Beta is the transistor current gain. Thus, since a typical IC transistor has a Beta of about 200, the two stage cascade has a current gain of 40,000 and a three stage cascade 8,000,000. The impedance of the output load appears at the input multiplied by the same values. Such isolation is useful in coupling a high voltage gain amplifier to a low impedance load.

Unfortunately, such cascades, while quite stable for resistive loads, can be unstable when driving capacitive loads. Under a severe capacitive load, the cascaded emitter followers can produce ringing in response to input transients. In an extreme case, the circuit can oscillate.

DESCRIPTION OF THE PRIOR ART

FIG. 1 is a schematic of a conventional Darlington connected emitter follower buffer amplifier. This is a cascade composed of two emitter followers. This circuit is used extensively in IC structures because the two transistors can share a common IC tub in the widely used PN junction isolated form of construction. A $V_S$ power supply is connected to + terminal 10 and ground terminal 11. Output terminal 12 produces a replica (voltage wise) of the signal input at terminal 13. Input transistor 14 acts as an emitter follower driving the base of output transistor 15. Resistor 16 is optional. It is usually included because the base current of transistor 15 is insufficient to properly set the emitter current of transistor 14. Load element 17 connected to terminal 12 will be driven by output transistor 15. The voltage gain from terminal 13 to terminal 12 is close to unity and the current gain is close to Beta squared. The input impedance looking into terminal 13 is the output impedance multiplied by the amplifier transimpedance. The number is close to Beta squared times the value of load resistor 17 for the circuit of FIG. 1. Thus, with transistor Betas of 200, the current gain will be about 40K and a 1K ohm load will appear at terminal 13 to produce an input resistance of about 40 megohms. Such isolation is very useful.

Unfortunately, when a capacitive load 18 is involved, a condition of instability can develop. Capacitor 18 can be reflected back through the cascade of stages as an inductance which can resonate with stray circuit capacitance. When a transient is applied to terminal 13, ringing can develop at output terminal 12. In extreme cases, such ringing can be sustained and the circuit will break into oscillation.

FIG. 2 is a schematic diagram of a circuit commonly employed to reduce such instability. Basically, a two stage emitter follower cascade is present as in FIG. 1. Where the elements are the same the same numerals are used. Resistor 19 has been added in series with the base of transistor 15 and resistor 20 has been added in series with output terminal 12. These resistors act to isolate the stray circuit capacitances.

FIG. 3 is a schematic diagram of a circuit that employs resistor 22 and capacitor 21 to stabilize the high frequency input impedance of driver transistor 14 in a conventional Darlington connected pair of transistors. This is an alternative approach to reduce instability.

FIG. 4 is a schematic diagram of a circuit that employs three cascaded emitter followers. A pair of transistors 14 and 15 are conventionally Darlington connected to drive output terminal 12. Complementary transistor 24, connected as an emitter follower, has been added to drive the base of transistor 14. Current source 23 acts as the load element of transistor 24. The current gain of such a circuit is close to Beta cubed. The circuit of FIG. 4 works well with resistive loads, but tends to become unstable when driving a capacitive load, shown in dashed connection form at 18, is present. FIG. 5 is a graph that plots the input admittance of the FIG. 4 circuit as a function of frequency. It can be seen that the circuit resonates at about 30 MHz. Curve 25 represents a load capacitance of 25 pf, curve 26 results from a 35 pf load and curve 27 results from a 45 pf load. Curve 26 has a minimum value of approximately 1 micromho and, if the input to the circuit provided a Norton equivalent conductance of only a few micromhos, the circuit would oscillate. Similar resonance effects can be observed in the voltage gain and output impedance characteristics. Even without oscillation, the circuit will ring following a drive signal transient. In terms of the gain versus frequency response of the circuit, a relatively large peak will be evident at about 30 MHz.

SUMMARY OF THE INVENTION

It is an object of the invention to avoid the resonance effects of plural cascaded emitter follower buffers.

It is a further object of the invention to apply local negative feedback in at least one stage in a plurality of emitter follower stages cascaded into a buffer circuit.

It is a still further object of the invention to couple a noninverting amplifier around an emitter follower stage to achieve negative feedback stabilization wherein the stabilized emitter follower can be employed in a cascade of emitter followers driving a capacitive load.

These and other objects can be obtained in a circuit configured as follows. A Darlington connected pair of transistors is connected as an emitter follower output stage and a complementary transistor is coupled as an emitter follower to drive the input of the Darlington pair driver transistor. Thus, the three transistors comprise a trio of cascaded emitter followers. In accordance with the invention a small resistor is coupled in series with the collector of the Darlington driver transistor. This resistor is made small enough that the operation of the driver transistor as an emitter follower is unimpaired. A stabilizing transistor which is complementary to the Darlington transistors has its emitter connected to the Darlington driver collector and the complementary transistor collector connected to the Darlington driver base. The base of the stabilizing complementary transistor is provided with a suitable bias voltage. Thus, the stabilizing transistor acts as a current source for the complementary emitter follower input transistor and it also functions as a common base noninverting amplifier so that it provides negative feedback around the Darlington driver. As a result, the resonance effects in the circuit are avoided and a stable three emitter follower buffer circuit action can be obtained.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWING

FIG. 1 is a simplified schematic diagram of the well known prior art Darlington connected emitter follower circuit.

FIG. 2 is a simplified schematic diagram of the circuit of FIG. 1 with a pair of compensating resistors in accordance with the prior art.

FIG. 3 is a simplified schematic diagram of the circuit of FIG. 1 with prior art high frequency compensation in the form of a series connected resistor-capacitor combination.

FIG. 4 is a simplified schematic diagram of the circuit of FIG. 1 further including an emitter follower input stage connected to drive the Darlington connected pair in accordance with the prior art.

FIG. 5 is a graph showing the input admittance of the FIG. 4 circuit as a function of frequency.

FIG. 6 is a simplified schematic diagram of the circuit of the invention.

FIG. 7 is a graph showing the input admittance of the FIG. 6 circuit as a function of frequency.

FIG. 8 is a schematic diagram of the preferred embodiment of the invention.

DESCRIPTION OF THE INVENTION

FIG. 6 is a simplified schematic diagram of the circuit of the invention. The basic circuit of FIG. 4 is present in that transistors 14, 15 and 24 comprise three emitter followers in a cascade coupled between output terminal 12 and input terminal 13. Resistor 27 has been added in the collector of transistor 14. This resistor is made relatively small so that it has very little effect upon the functioning of transistor 14 as an emitter follower driver. Transistor 28 has its emitter coupled to the collector of transistor 14 and its collector coupled to the base of transistor 14. The base of transistor 28 is operated at a $V_{BIAS}$ level potential applied by way of terminal 29. This potential is slightly greater than one diode below the supply line connected to $+V_S$ terminal 10. Thus, transistor 28, in addition to serving as current source 23 in FIG. 4, also operates as a common base noninverting amplifier which feeds the collector potential of transistor 14 back to its base. The signal inversion in transistor 14 makes this feedback loop negative. This local negative feedback stabilizes the amplifier cascade and eliminates the tendency, described above, for such circuits to ring or oscillate.

FIG. 7 is a graph plotting the input admittance of the circuit of FIG. 6 as a function of frequency. Curve 30 results from driving a 25 pf capacitive load. Curves 31 and 32 respectively relate to 35 pf and 45 pf loads. As can be seen by comparing FIG. 7 with FIG. 5, the circuit instability shown by the resonances has been eliminated.

FIG. 8 is a schematic diagram of the preferred embodiment of the invention which is incorporated into the LM6104 integrated circuit. Where the elements are the same as those of FIG. 6, the same numerals are used. The negative $V_S$ terminal 11, instead of being grounded, acts as a negative supply line that operates a complementary circuit, shown as current sinks 35 and 41, and which forms a mirror image of the upper circuit portion. This provides a low impedance drive for output terminal 12. The lower half of the circuit, which is not shown in detail, can also be employed to create a differential-to-single ended conversion if a differential input stage is used.

As pointed out in connection with FIG. 6, circuit node 29 comprises the bias terminal for transistor 28. In FIG. 8, resistors 34 and 38, diode 33 and transistors 36 and 37 form a Wilson current mirror the input of which is the collector current of transistor 39. The current mirror, needed to level shift the input signal to the high-impedance node 13, provides a convenient means to generate the base voltage for transistor 28. If transistor 37 and diode 33 have equal emitter areas and resistors 34 and 38 are matched, then the magnitude of the collector current of transistor 36 will equal the collector current of transistor 39. As described above, transistor 28 acts as the load element for emitter follower transistor 24. If transistor 28 and 37 have equal emitter areas and resistors 27 and 38 are matched, then the emitter current of transistor 28 will be approximately equal to that of transistor 37, less a small amount due to the collector current of transistor 14.

Since node 13 is driven by the output of a Wilson current mirror and current source 35, which can be formed by a complementary Wilson current mirror, it has a very high driving-point impedance. The transimpedance gain of the circuit from node 41 to node 13 can be very high. Thus, the three emitter follower cascade is employed to buffer the high impedance at node 13 from low impedance loads which may be present at the output node 12 to maintain the high gain.

In view of the foregoing, it can be concluded that the circuit of FIG. 8 provides a noninverting buffer function which includes very high gain, can be complemented with a differential input if desired, and has a low output impedance. It is stable even in the presence of capacitive loads While the preferred embodiment of the invention involves a three transistor cascade of emitter followers with local negative feedback around the second stage, it is to be understood that other configurations could be employed. For example, more or fewer emitter follower cascade stages could be employed. Also, the local negative feedback could be applied around a stage other than the second or even around two or more stages in the cascade.

EXAMPLE

The circuit of FIG. 8 was constructed using the complementary IC transistors as described in U.S. Pat. 4,910,160. The following component values were employed:

| COMPONENT | VALUE (OHMS) |
| --- | --- |
| Resistor 16 | 10K |
| Resistor 17 | 300 |
| Resistor 18 | 5 |
| Resistors 27, 34 and 38 | 50 |

A power supply of 13 volts was employed and the circuit quiescent current was 0.7 ma. The circuit could supply a peak output current of 40 ma and could be driven to within 1.6 volts of the supply rail at 300° K. The transimpedance from circuit node 41 to output terminal 12 was $20 \times 10^6$ ohms. The circuit could drive capacitive loads and showed no instability for load capacitances as high as 200 pf.

The invention has been described and a preferred embodiment detailed. Alternatives have also been described. When a person skilled in the art reads the foregoing description, other alternatives and equivalents, within the spirit and intent of the invention, will be apparent. Accordingly, it is intended that the scope of the invention be limited only by the claims that follow.

I claim:

1. A local feedback stabilized emitter follower buffer amplifier circuit comprising:
    a first npn transistor (15) having its emitter connected to an output terminal (12) and its collector connected to a positive terminal (10) of a power supply (Vs);
    a second npn transistor (14) having its emitter connected directly to the base of the first npn transistor (15) and to the output terminal (12) via a first resistor (16) and its collector connected to the positive terminal (10) via a second resistor (27);
    a first pnp transistor (24) having its emitter connected to the base of the second npn transistor (14), its collector connected to a negative terminal (11) of the power supply, and its base connected to an input signal terminal; and
    a second pnp transistor (28) having its emitter connected to the collector of the second npn transistor, its collector connected to the emitter of the first pnp transistor, and its base connected to a bias potential input terminal.

2. A local feedback stabilized emitter follower buffer amplifier circuit as in claim 1 and wherein the second resistor (27) is small in relation to the second npn transistor (14) so that said second resistor (27) has little effect upon the functioning of the second npn transistor (14) as an emitter follower driver.

3. A local feedback stabilized emitter follower buffer amplifier circuit comprising:
    a first npn transistor (15) having its emitter connected to an output terminal (12) via an output resistor (18) and its collector connected to a positive terminal of a power supply;
    a first current sink (41) connected between the output terminal (12) and a negative terminal of the power supply;
    a second npn transistor (14) having its emitter connected to the base of the first npn transistor (15) and to the emitter of the first npn transistor (15) via a first resistor (16) and its collector connected to the positive terminal via a second resistor (27);
    a first pnp transistor (24) having its emitter connected to the base of the second npn transistor (14) via a base resistor (17) and its collector connected to the negative terminal;
    a second pnp transistor (28) having its emitter connected to the collector of the second npn transistor (14), its collector connected to the emitter of the first pnp transistor (24), and its base connected to a first circuit node (29);
    a third npn transistor (39) having its emitter connected to the negative terminal, its collector connected to a second circuit node (41), and its base connected to an input signal terminal (40);
    a third pnp transistor (37) having its emitter connected to the positive terminal via a second resistor (38), its collector connected to the second circuit node (41), and its base connected to the first circuit node (29);
    a third resistor (34) and a diode (33) connected in series between the positive terminal and the first circuit node (29);
    a fourth pnp transistor (36) having its emitter connected to the first circuit node (29), its collector connected to a third circuit node (13) and its base connected to the second circuit node (41); and
    a second current sink (35) connected between the third circuit node (13) and the negative terminal.

4. A local feedback stabilized emitter follower buffer amplifier circuit as in claim 3 and wherein the second resistor (27) is small in relation to the second npn transistor (14) so that said second resistor (27) has little effect upon the functioning of the second npn transistor (14) as an emitter follower driver.

* * * * *